United States Patent [19]
Naruse et al.

[11] Patent Number: 6,110,642
[45] Date of Patent: Aug. 29, 2000

[54] PHOTOSENSITIVE LITHOGRAPHIC PLATE AND PROCESS FOR PRODUCING SAME

[75] Inventors: Yasuhito Naruse, Shizuoka, Japan; Kenji Shinoda, Berlin, Germany

[73] Assignee: Fuji Photo Film Co., Ltd., Minami-Ashigara, Japan

[21] Appl. No.: 09/089,344

[22] Filed: Jun. 3, 1998

[30] Foreign Application Priority Data

Jun. 6, 1997 [JP] Japan ................................. 9-165356
Mar. 25, 1998 [JP] Japan ................................. 10-096720

[51] Int. Cl.$^7$ ..................................................... G03F 7/11
[52] U.S. Cl. ................... 430/273.1; 430/162; 430/276.1; 430/271.1; 430/950; 430/525
[58] Field of Search ................................ 430/162, 276.1, 430/271.1, 273.1, 950, 525

[56] References Cited

U.S. PATENT DOCUMENTS

| | | | |
|---|---|---|---|
| 4,557,994 | 12/1985 | Nagano et al. | 430/162 |
| 4,781,941 | 11/1988 | Inukai et al. | 427/27 |
| 5,028,512 | 7/1991 | Nagatani et al. | 430/162 X |

FOREIGN PATENT DOCUMENTS

| | | |
|---|---|---|
| 51-96604 | 8/1976 | Japan . |
| 51-111102 | 10/1976 | Japan . |
| 53-134502 | 11/1978 | Japan . |
| 55-12974 | 1/1980 | Japan . |
| 7-132688 | 5/1995 | Japan . |

OTHER PUBLICATIONS

Database WPI, Section Ch, Week 8644, Derwent Publications Ltd., London, GB; Class A89, AN 86–289524, XP002075438 & JP 61–213843A (Fuji Photo Film Co. Ltd.) *abstract*.

Database WPI, Section Ch, Week 8848, Derwent Publications Ltd., London, GB; Class A89, AN 88–341847 XP002075439 & JP 63–253941A (Fuji Photo Film Co. Ltd.) *abstract*.

Patent Abstracts Of Japan, vol. 011, No. 168 (M–594), May 29, 1987 & JP 62–001586A (Fuotopori Ouka KK), Jan. 7, 1987 *abstract*.

*Primary Examiner*—Cynthia Hamilton
*Attorney, Agent, or Firm*—Burns, Doane, Swecker & Mathis, LLP

[57] ABSTRACT

In a photosensitive lithographic plate including a photosensitive layer coated on the surface of a substrate and a mat layer formed on the photosensitive layer, plural resinous protrusions are provided on the back surface of the substrate in the form of a layer. Deterioration of vacuum adhesion due to the mat collapsed in a production process of a photosensitive lithographic plate including a step of winding is prevented, consequently, a photosensitive lithographic plate with uniform quality is obtained regardless of its wound position.

10 Claims, 1 Drawing Sheet

PHOTOSENSITIVE LITHOGRAPHIC PLATE AND PROCESS FOR PRODUCING SAME

FIELD OF THE INVENTION

The present invention relates to a photosensitive lithographic or planographic plate and process for preparing, more especially to a photosensitive lithographic plate capable of wound into a coiled form and its production process.

DESCRIPTION OF THE RELATED ART

Up to this time, various techniques have been proposed concerning the production of a photosensitive lithographic plate one of which includes a step of matting the surface of a photosensitive lithographic plate for improving its vacuum adhesion, or complete contact. By the way, onto this photosensitive lithographic plate an image is formed by the following process. In an imagewise exposing step, a film original is superimposed on the photosensitive lithographic plate, and light is exposed through the film original to focus the original image on a photosensitive layer of the photosensitive lithographic plate. Here, in order to obtain a sharp image, light-exposing is required after placing the original film in complete contact with the photosensitive layer of the photosensitive lithographic plate so as not to result in defocusing the exposed image from their interspace. To this end, there has been generally put into practice a process of placing a photosensitive lithographic plate in complete contact with a film original which includes steps of using a frame for vacuum exposing equipped with a glass plate and a rubber sheet, placing the photosensitive lithographic plate and the film original superimposed thereon between the glass plate and the rubber sheet into the frame for exposing, and evacuating the interspace of the glass plate and the rubber sheet (hereinafter referred to as "vacuum contact process"). Here, matting the photosensitive layer, which is disclosed in Japanese Patent Kokai Publication No.JP-A-51-111102 (1976), is considered effective to markedly shorten a time required for tight vacuum adhesion to a high extent, and it is put into practice now. Technologies concerning the formation of such a fine uneven pattern (matting) are disclosed in, for example, U.S. Pat. No. 4,216,289 which corresponds to Japanese Patent Kokai Publication No. JP-A-51-96604 (1976) and Japanese Patent Kokai Publication No. JP-A-55-12974 (1980). Besides, Japanese Patent Kokai Publication No. JP-A-7-132688 (1995) discloses a process for preparing a substrate for a photosensitive lithographic plate, which includes a step of forming an uneven pattern on the back surface of the substrate with the substrate itself, thereby a photosensitive lithographic plate which is light in weight, conserves resources and is excellent in flatness is made possible to be provided notwithstanding it has the same thickness as that of the conventional plate.

SUMMARY OF THE DISCLOSURE

However, the mat provided on the photosensitive layer surface by the application of the above processes causes a problem, especially when a photosensitive lithographic plate is prepared in a process including a step of winding the photosensitive lithographic plate into a coil that the mat is collapsed by a pressure generated in a coil by winding, especially, near a coil core so that the desired effect of shortening a time required for tight vacuum adhesion cannot be obtained. Explaining more in detail, the photosensitive lithographic plate wound near the core requires a lot of time for placing it in complete contact with the film original in light-exposing, thereby, operational time required for plate making step cannot be shortened as well as there is the possibility of deteriorating the sharpness of image by the air residual between the photosensitive lithographic plate and the film original in the course of light-exposing.

In addition, the process disclosed in Japanese Patent Kokai Publication No.JP-A-7-132688 (1995) makes it possible to prevent the collapse of the mat, but involves a problem that flaws are produced on the photosensitive layer by the unevenness formed on the back surface of the photosensitive lithographic plate during winding, processing or transporting.

Therefore, it is an object of the present invention to provide a photosensitive lithographic plate and its production process in which the deterioration of vacuum adhesion due to the mat collapsed in a production process of a photosensitive lithographic plate including a step of winding is prevented, consequently, a photosensitive lithographic plate with uniform quality is obtained regardless of its coiled position.

Further objects of the present invention will become apparent in the entire disclosure.

The inventors of the present invention studied to prevent the collapse of the mat in a process of preparing a photosensitive lithographic plate including a step of winding, and achieved the present invention. In order to solve the above problems, a first aspect of a photosensitive lithographic plate according to the present invention includes a plurality of resinous protrusions provided on the back surface of a substrate in a layer.

The substrate has a photosensitive layer coated on the surface of the substrate and a mat layer formed on the photosensitive layer. An especially preferable process for preparing the photosensitive lithographic plate includes a step of coating a resin on the back surface of the substrate. In addition, in a second aspect, the plural projections have an average height in a central line of 4 to 30 μm relative to the back surface of the photosensitive lithographic plate. According to the photosensitive lithographic plate of the present invention having such features as described above, a winding pressure generated in a wound up coil is applied through the protrusions defined above so that winding can be performed without affecting pressure onto the mat provided on the photosensitive layer surfaces. Thereby, the deterioration of vacuum tight adherence due to the collapse of the mat is prevented. Further, conditions of the mat are independent of the wound photosensitive lithographic plate position, and the photosensitive lithographic plate has a uniform quality due to vacuum adhesion, consequently, the vacuum adhesion can be achieved within a predetermined shortened time.

Moreover, no matter whether there is a winding step in the course of manufacturing or not, load is absorbed at the aforementioned protrusions so that the endurance of the photosensitive lithographic plate to load is significantly improved. Still more, the protrusions in the form of a layer are provided on the back surface of the substrate, and the photosensitive lithographic plate is supported by the protrusions even on a printer to be applied, consequently, in proportion to the formed protrusions the use amount of a substrate material can be reduced, thereby, the material cost of interest can be saved to provide a photosensitive lithographic plate at a low cost.

PREFERRED EMBODIMENTS OF THE INVENTION

Figure 1:
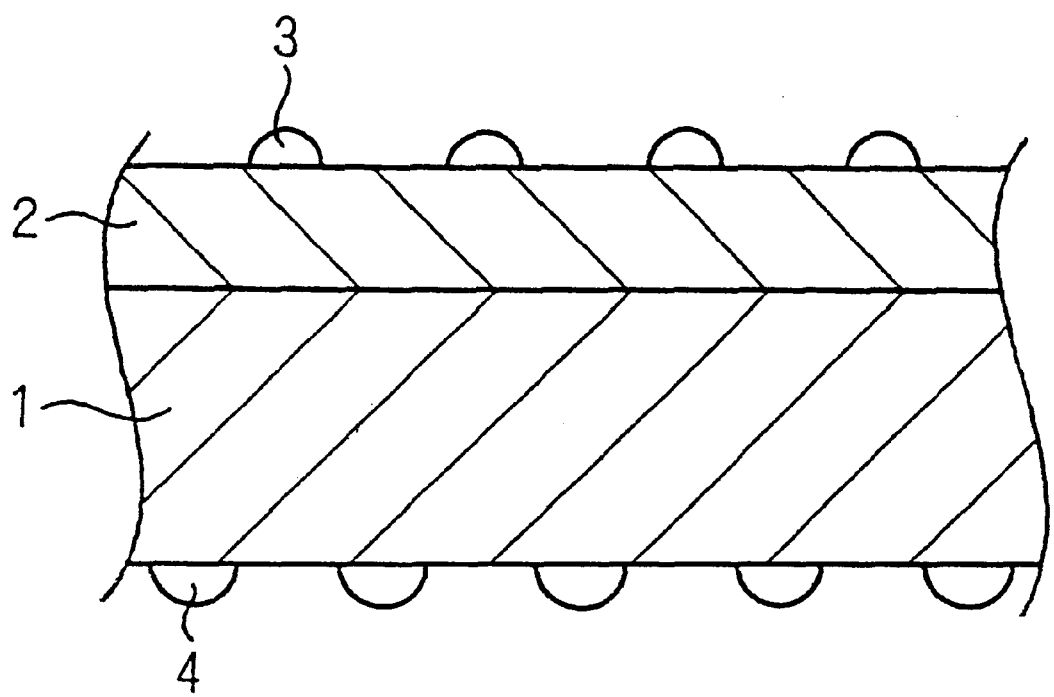
FIG. 1 is a cross sectional view of a photosensitive lithographic plate relating to an embodiment of the present invention.

The preferred embodiments of the present invention will be explained below. FIG. 1 shows a cross-sectional structure of a photosensitive printing plate. With reference to FIG. 1, on the surface of a substrate 1 for a photosensitive printing plate, a photosensitive layer 2 is coated; on the photosensitive layer, a mat layer 3. On the back surface of the substrate 1 plural resinous protrusions 4 are formed in a layered fashion. As to the substrate 1, an aluminum plate is usually used.

The aluminum plate used in a photosensitive lithographic plate according to the present invention is selected from pure aluminum plate, alloy plate including aluminum mainly and a very small quantity of foreign elements and plastic film on which aluminum is mixed or deposited. Examples of the foreign element included in the aluminum alloy are silicon, iron, nickel, manganese, copper, magnesium, chromium, zinc, bismuth, titanium, vanadium and the like. Usually, those disclosed in ALUMINUM HANDBOOK, 4-th edition 1990, Keikinzoku Kyokai (Light Metal Association, Japan), which havebeen hitherto known, e.g., JIS A 1050 material, JIS A 3103 material, JIS A 3005 material, JIS A 1100 material, JIS 3004 material, or in order to increase tensile strength, alloy including 5% or less by weight of magnesium added thereto are used. Otherwise, an aluminum plate prepared by the process in which interim annealing is skipped is also used. Roll finish may be plane finish or mill finish.

The aluminum plate may be prepared by the usual process of DC casting or by continuous casting and rolling. As to the process of continuous casting and rolling, rolling process by dual rolls, belt-casting process, block-casting process or the like can be applied. The thickness of the aluminum plate used in the present invention ranges approximately from 0.1 to 0.6 mm.

On the substrate of a photosensitive lithographic plate according to the present invention one of the following photosensitive layers can be provided.

[I] In the case of providing a photosensitive layer of novolak resin including o-napthoquinonediazide sulfonate and phenol-cresol:

O-quinonediazide compound is o-naphthoquinonediazide compound, which is disclosed in many of publications including, for example, each specification of U.S. Pat. Nos. 2,766,118, 2,767,092, 2,772,972, 2,859,112, 3,102,809, 3,106,465, 3,635,709 and 3,647,443. Those disclosed in these references may be used preferably. Among them, especially preferable ones are o-napthoquinonediazide sulfonate or carboxylate of aromatic hydroxyl compounds and o-naphthoquinonediazide sulfonamide or carboxyamide of aromatic amino compounds; especially excellent ones are esterification products, of pyrogallol-acetone condensation product and o-naphthoquinonediazide sulfonic acid, which are disclosed in the specification of U.S. Pat. No. 3,635,709; esterification products, of polyester having a hydroxyl group at the terminal and o-naphthoquinonediazide sulfonic or carboxylic acid, which are disclosed in the specification of U.S. Pat. No. 4,028,111; esterification products of p-hydroxystyrene homopolymer or copolymer with copolymerizable monomer and o-naphthoquinonediazide sulfonic acid or carboxylic acid, as disclosed in the specification of British Patent Publication No. 1,494,043; amide reaction products, of p-aminostyrene copolymer with other copolymerizable monomer and o-naphthoquinonediazide sulfonic acid or carboxylic acid.

These o-quinonediazide compounds may be used solely, but preferably in combination with an alkali-soluble resin. Preferable alkali-soluble resins include novolak type phenol resin, more concretely, phenol-formaldehyde resin, o-cresol-formaldehyde resin, m-cresol-formaldehyde resin and the like. Further, it is more preferable to use the aforementioned phenol resin together with a condensation product of phenol or cresol, each of which is substituted by an alkyl group having 3 to 8 carbon atoms, and formaldehyde, as disclosed in the specification of U.S. Pat. No. 4,028,111.

Moreover, in order to form a visible image with exposure, one or more selected from o-naphthoquinonediazide-4-sulfonylchloride, inorganic anionic salts of p-diazophenylamine, trihalomethyloxadiazole compounds with or without benzofuran ring and the like, is added. On the other hand, as a colorant, triphenylmethane dye such as Victoria Blue BOH, Crystal Violet, Oil Blue and the like is used. Especially preferable dye is that disclosed in Japanese Patent Kokai Publication No.JP-A-62-293247 (1987).

Still more, as a sensitizer, phenol substituted by alkyl group having 3 to 15 carbon atoms as disclosed in Japanese Patent Kokoku Publication No.JP-B-57-23253 (1982) may be added. These examples include tert-butylphenol, N-octylphenol, novolac resin prepared by condensation of t-butylphenol and formaldehyde. Otherwise, o-naphthoquinonediazide-4-(or -5-)sulfonate of the above type novolak resin (disclosed in e.g., Japanese Patent Kokai Publication No.JP-A-61-242446 (1986)) may be added.

Then, in order to improve developed properties, such non-ionic surfactants as disclosed in Japanese Patent Kokai Publication No.JP-A-62-251740 (1987) may be added.

The above composition is dissolved in a solvent which can dissolve each of the aforementioned ingredients and be coated on the substrate. Here, the solvent employed may be ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, methyl lactate, ethyl lactate, dimethyl sulfoxide, dimethylacetamide, dimethylformamide, water, N-methylpyrrolidone, tetrahydrofurfuryl alcohol, acetone, diacetone alcohol, methanol, ethanol, isopropanol, diethylene glycol dimethyl ether or the like. These solvent may be used solely or in combination.

A photosensitive composition including those ingredients is provided on the substrate in an amount of 0.5 to 30. $g/m^2$ in terms of its solid content.

[II] In the case of providing a photosensitive layer including diazo resin and water-insoluble hydrophobic high-molecular compound:

Examples of diazo resin include inorganic salt of diazo resin, which is an organic-solvent-soluble reaction product obtained by reacting a condensation product of p-diazodiphenylamine and formaldehyde or acetoaldehyde with hexafluorophosphate or tetrafluoroborate; organic-solvent-soluble organic salt of diazo resin as disclosed in U.S. Pat. No. 3,300,309, which is a reaction product of the aforementioned condensation product with sulfonic acids such as p-toluenesulfonic acid or their salts, or with phosphinic acids such as benzenephosphinic acid or their salts, or with hydroxyl group-containing compounds such as 2,4-dihydroxybenzophenone, 2-hydroxy-4-methoxybenzophenone-5-sulphonic acid or its salt; and the like.

Other diazo resins preferably used in the present invention include a co-condensation product having structural units derived from: an aromatic compound having at least one organic group selected from carboxyl group, sulfonic group, sulfinic group, oxyacid group of phosphorus and hydroxyl group; and diazonium compound, preferably, aromatic diazonium compound. The above aromatic ring preferably includes phenyl or naphthyl group.

There are many kinds of the aforementioned aromatic compounds having at least one organic group selected from carboxyl group, sulfonic group, sulfinic group, oxyacid group of phosphorus and hydroxyl group. Among them those preferable are 4-methoxybenzoic acid, 3-chlorobenzoic acid, 2,4-dimethoxy benzoic acid, p-phenoxybenzoic acid, 4-anilinobenzoic acid, phenoxyacetic acid, phenylacetic acid, p-hydroxylacetic acid, 2,4-dihydroxyacetic acid, benzene sulfonic acid, p-toluenesulfinic acid, 1-naphthalene sulfonic acid, phenylphosphoric acid, phenylphosphonic acid. As to the aromatic diazonium compound which can be changed into the structural unit of the aforementioned co-condensation diazo resin product, such diazonium salts as disclosed in Japanese Patent Kokoku Publication No.JP-B-49-48001 (1974) may be used. Among them, diphenylamine-4-diazonium salts are especially preferable.

The diphenylamine-4-diazonium salts are derived from 4-aminodiphenylamines. Examples of these 4-aminodiphenylamines include 4-aminodiphenylamine, 4-amino-3-methoxydiphenylamine, 4-amino-2-methoxydiphenylamine, 4'-amino-2-methoxydiphenylamine, 4'-amino-4-methoxydiphenylamine, 4-amino-3-methyldiphenylamine, 4-amino-3-ethoxydiphenylamine, 4-amino-3-β-hydroxyethoxydiphenylamine, 4-aminodiphenylamine-2-sulfonic acid, 4-aminodiphenylamine-2-carboxylic acid, 4-aminodiphenylamine-2'-carboxylic acid and the like. Especially preferable ones are 3-methoxy-4-amino-4-diphenylamine and 4-aminodiphenylamine.

As to diazonium resins other than the co-condensation diazonium resin product prepared by using an aromatic compound having acid radical, diazonium resins, disclosed in Japanese Patent application Nos. 1-130493 (1989), 1-303705 (1989) and 2-53101 (1990), which are obtained by condensation with aldehyde having acid radical or its acetal compound can be preferably used.

Counter anions of the diazonium resin include anions which form stable salts with diazonium resin and make the diazonium resin soluble in an organic solvent. These include organic carboxylic acids such as decanoic acid; benzoic acid and the like; organic phosphoric acids such as phenylphosphoric acid; and sulfonic acids. Typical examples of these compounds include methanesulfonic acid; fluoroalkanesulfonic acids such as trifluoromethanesulfonic acid and the like; aliphatic and aromatic sulfonic acids such as laurylsulphonic acid, dioctylsulfosuccinic acid, dicyclohexylsulfosuccinic acid, camphorsulfonic acid, tolyloxy-3-propanesulfonic acid, nonylphenoxy-2-propanesulfonic acid, nonylphenoxy-4-butanesulfonic acid, dibutylphenoxy-3-propanesulfonic acid, diamylphenoxy-3-propanesulfonic acid, dinonylphenoxy-3-propanesulfonic acid, dibutylphenoxy-4-butanesulfonic acid, dinonylphenoxy-4-butanesulfonic acid, benzenesulfonic acid, toluenesulfonic acid, mesitylenesulfonic acid, p-chlorobenzenesulfonic acid, 2,5-dichlorobenzenesulfonic acid, sulfosalicylic acid, 2,5-dimethylbenzenesulfonic acid, pacetylbenzenesulfonic acid, 5-nitro-otoluenesulfonic acid, 2-nitrobenzenesulfonic acid, 3-chlorobenzenesulfonic acid, 3-bromobenzenesulfonic acid, 2-chloro-5-nitrobenzenesulfonic acid, butylbenzenesulfonic acid, octylbenzenesulfonic acid, decylbenzenesulfonic acid, dodecylbenzenesulfonic acid, butoxybenzenesulfonic acid, dodecyloxybenzenesulfonic acid, 2-hydroxy-4-methoxybenzophenone-5-sulfonic acid, isopropylnaphthalenesulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitronaphthalene-3,6-disulfonic acid, dimethyl-5-sulfoisophthalate and the like; hydroxyl-group-containing aromatic compounds such as 2,2',4,4'-tetrahydroxybenzophenone, 1,2,3-trihydroxybenzophenone, 2,2',4-trihydroxybenzophenone and the like; halogenated Lewis acids such as hexafluorophosphoric acid, tetrafluoroboric acid and the like; perhalogenic acids such as $ClO_4$, $IO_4$ and the like, but these compounds exemplified above never limit the present invention. Among them, especially preferable ones are butylnaphthalenesulfonic acid, dibutylnaphthalenesulfonic acid, hexafluorophosphoric acid, 2-hydroxy-4-methoxybenzophenone-5-sulfonic acid and dodecylbenzenesulfonic acid.

The molecular weight of the diazonium resin used in the invention can be changed depending on the molar ratio of monomers and condensing conditions and may have arbitrary values, however, it is adequate to be approximately in the range of 400 to 100,000, preferably to be approximately in the range of 800 to 8,000 in order that the diazonium resin is effective for its use. The water-insoluble hydrophobic high-molecular compound may be a copolymer having one or more structural unit derived from the following monomers (1) to (15) and usually having a molecular weight of 10,000 to 200,000:

(1) acrylamides, methacrylamides, acrylic esters, methacrylic esters, hydroxystyrenes, each of these having an aromatic hydroxyl group, for example, N-(4-hydroxyphenyl)acrylamide, N-(4-hydroxyphenyl)methacrylamide, o-,m-,p-hydroxystyrene and o-,m-p-hydroxyphenyl-acrylate or -methacrylate;

(2) acrylic or methacrylic esters having an aliphatic hydroxyl group such as 2-hydroxyethyl acrylate, 2-hydroxyethyl methacrylate and 4-hydroxybutyl methacrylate;

(3) unsaturated carboxylic acids such as acrylic acid, methacrylic acid, maleic anhydride, itaconic acid and the like;

(4) substituted and unsubstituted alkyl acrylates such as methyl acrylate, ethyl acrylate, propyl acrylate, butyl acrylate, amyl acrylate, hexyl acrylate, cyclohexyl acrylate, octyl acrylate, benzyl acrylate, 2-chloroethyl acrylate, glycidyl acrylate, N-dimethylaminoethyl acrylate and the like;

(5) substituted and unsubstituted alkyl methacrylates such as methyl methacrylate, ethyl methacrylate, propyl methacrylate, butyl methacrylate, amyl methacrylate, cyclohexylmethacrylate, benzylmethacrylate, glycidyl methacrylate, N-dimethylaminoethyl methacrylate and the like;

(6) acryl- or methacryl-amides such as acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide and the like;

(7) vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like;

(8) vinyl esters such. as vinyl acetate, vinyl chloroacetate, vinyl butylate, vinyl benzoate and the like;

(9) styrenes such as styrene, α-methylstyrene, chloromethylstyrene and the like;
(10) vinylketones such as methyl vinyl ketone, ethyl vinyl ketone, propyl vinyl ketone, phenyl vinyl ketone and the like;
(11) olefins such as ethylene, propylene, isobutylene, butadiene, isoprene and the like;
(12) N-vinylpyrrolidone, N-vinylcarbazole, 4-vinylpyridine, acrylonitrile, methacrylonitrile and the like;
(13) unsaturated imides such as maleinimide, N-acryloylacrylimide, N-acetylmethacrylimide, N-propionylmethacrylimide, N-(p-chlorobenzoyl) methacrylimide and the like;
(14) aminosulfonyl acrylamides such as N-(o-aminosulfonylphenyl)methacrylamide, N-(m-aminosulfonylphenyl)methacrylamide, N-(p-aminosulfonylphenyl)methacrylamide, N-(1-(3-aminosulfonyl)naphthyl)methacrylamide, N-(2-aminosulfonylethyl)methacrylamide; acrylamides having the same substituent group as disclosed above; methacrylic esters such as o-aminosulfonylphenyl methacrylate, m-aminosulfonylphenyl methacylate, p-aminosulfonylphenyl methacrylate, 1-(3-aminosulfonylnaphthyl) methacrylate and the like; acrylic esters having the same substituent group as disclosed above; and the like;
(15) unsaturated monomers having a crosslinkable group at the side chain thereof such as N-(2-(methacryloyloxy)-octyl)-2,3-dimethylmaleinimide, vinyl cinnamate and the like; and copolymerization products of one or more of these monomer with other copolymerizable monomer;
(16) phenol resins disclosed in U.S. Pat. No. 3,751,257 and polyvinyl acetal resins such as polyvinyl formal resin, polyvinyl butyral resin;
(17) alkali-soluble high-molecular compounds, obtained from polyurethane, disclosed in Japanese Patent Kokoku Publication No.JP-B-54-19773 (1979), Japanese Patent Kokai Publication Nos.JP-A-57-94747 (1982), JP-A-60-182437 (1985), JP-A-62-58242 (1987), JP-A-62-123452 (1987), JP-A-62-123453 (1987), JP-A-63-113450 (1988), JP-A-2-146042 (1990).

Preferable molecular weight of the above copolymer ranges from 10,000 to 200,000. To the copolymer one or more selected from polyvinyl butyral resin, polyurethane resin, polyamide resin, epoxy resin, novolak resin, natural resin and the like may be added.

To the photosensitive composition of the present invention may also include one or more dyes for the purpose of obtaining a visible image after exposing and developing. Examples of dyes which change color to colorlessness or to different one include triphenylmethane, diphenylmethane, oxazine, xanthene, iminonaphthoquinone, azomethine or anthraquinone dyes such as Victoria Pure Blue BOH (trade name of Hodogaya Chemical Co., Ltd.), Oil Blue #603 (Orient Chemical Industry Co., Ltd.), Patent Pure Blue (Sumitomo Sangoku Chemical Co., Ltd), Crystal Violet, Brilliant Green, Ethyl Violet, Methyl Violet, Methyl Green, Erythrosine B, Basic Fuchsine, Malachite Green, Oil Red, m-cresol purple, p-damine B, Auramine, 4-p-diethylaminophenyl iminonaphthoquinone, cyano-p-diethylaminophenylacetoanilide and the like.

On the other hand, examples of dyes which change colorlessness to color include leuco dyes; and primary and secondary arylamine dyes such as triphenylamine, diphenylamine, o-chloroaniline, 1,2,3-triphenylguanidine, naphthylamine, diaminodiphenylamine, p,p'-bis-dimethylaminodiphenylamine, 1,2-dianilinoethylene, p,p', p"-trisdimethylaminotriphenylmethane, p,p'-bisdimethylaminodiphenylmethylimine, p,p',p"-triamino-o-methyltriphenylmethane, p,p'-bisdimethylaminodiphenyl-4-anilinphthylmethane, p,p',p"-triaminotriphenylmethane and the like. Preferable ones are triphenylmethane and diphenylmethane dyes; more preferable, triphenylmethane dyes; especially preferable, Victoria Pure Blue BOH.

To the photosensitive composition of the present invention, various kind of additives may be also incorporated. Examples of these additives include alkyl ethers, for improving coating properties, such as ethyl cellulose and methyl cellulose; fluoro- and nonionic surfactants, (especially, fluorosurfactants are preferable); plasticizers, for imparting flexibility and wear resistance to a film coated on the substrate, such as polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomer or polymer of acrylic or methacrylic acid, (especially, tricresyl phosphate is preferable among them); fat-sensitizers, for improving fat-sensitivity of the image portion, including those disclosed in Japanese Patent Kokai Publication No.JP-A-55-527 (1980), such as half-esterification product of a styrene-maleic anhydride copolymer and alcohol, novolak resin, e.g., p-tert-butylphenol-formaldehyde resin, 50% fatty acid ester of p-hydroxystyrene; stabilizers including phosphoric acid, phosphorous acid, organic acids such as citric acid, oxalic acid, dipicolinic acid, benzenesulfonic acid, naphthalenesulfonic acid, sulfosalicylic acid, 4-methoxy-2-hydroxybenzophenone-5-sulfonic acid, tartaric acid and the like; and developing accelerators such as higher alcohols, acid anhydrides and the like.

A layer of the aforementioned photosensitive composition may be provided on a substrate by preparing a coating solution of the photosensitive composition by dissolving a predetermined amount of photosensitive diazonium resin, hydrophobic high-molecular compound, and if necessary, various kinds of additives into an adequate solvent; applying the resultant coating solution on the substrate; and then drying the resultant coating. Examples of the solvent include methyl cellosolve, ethyl cellosolve, dimethoxyethane, diethylene glycol monomethyl ether, diethylene glycol dimethyl ether, 1-methoxy-2-propanol, methyl cellosolve acetate, acetone, methyl ethyl ketone, methanol, dimethylformamide, dimethylacetamide, cyclohexanone, dioxane, tetrahydrofuran, methyl lactate, ethyl lactate, ethylene dichloride, dimethyl sulfoxide, water or a mixture thereof.

Single kind of the above solvent may be used, however, it is preferable to use a mixture of high-boiling point solvent, such as methyl cellosolve, 1-methoxy-2-propanol and methyl lactate, with low-boiling point solvent such as methanol and methyl ethyl ketone. The solid content of the photosensitive composition in coating is desirable in the range of 1 to 50% by weight. In this case, the coating weight of the photosensitive composition may approximately range from 0.2 to 10 $g/m^2$, preferably from 0.5 to 3 $g/m^2$ in terms of the weight after drying.

[III] In the case of providing a photosensitive layer including a photodimerizable or photopolymerizable composition:

The photodimerizable composition includes a polymer having one or more of maleimide group, cinnamyl group, cinnamoyl group, cinnamylidene group, cinnamylidene-acetyl group and chalcone group at the side or main chain thereof. Polymers having maleimide group at their side chain may be found in Japanese Patent Kokai Publication No.JP-A-52-988 (1977) (corresponding U.S. Pat. No. 4,079, 041), the specification of German Patent publication No. 2,626,769, the specifications of European Patent Publication Nos. 21,019 and 3,552, Die Angewandte Makromolekulare Chemie Vol. 115 (1983), p. 163 to 181, Japanese Patent Kokai Publication Nos. JP-A-49-128991 (1974), JP-A-49-128992 (1974), JP-A-49-128993 (1974), JP-A-50-5376 (1975), JP-A-50-5377 (1975), JP-A-50-5379 (1975), JP-A-50-5378 (1975), JP-A-50-5380 (1975), JP-A-53-5298 (1978), JP-A-53-5299 (1978), JP-A-50-5300 (1978), JP-A-50-50107 (1975), JP-A-51-47940 (1976), JP-A-52-13907 (1978), JP-A-50-45076 (1975), JP-A-52-121700 (1977), JP-A-50-10884 (1975) and JP-A-50-45087 (1975), German Patent Publication Nos. 2,349,948 and 2,617,276.

In order to make these polymers soluble or swellable in an alkali solution, carboxylic acid, sulfonic acid, phosphoric acid, phosphonic acid or their alkali metal or ammonium salt may be effective, or otherwise, incorporating an acid radical or the like, having pKa of 6 to 12 and capable of dissociating in an alkali water, into the polymer in question may be effective. It is possible to copolymerize 1 to 3 kind of monomers having the above acid radical with monomers having a maleimide group, if necessary.

The acid value of a maleimide polymer having the acid radical preferably ranges from 30 to 300. Among polymers having such range of acid value, copolymers, of N-[2-(methacryloyloxy)ethyl]-2,3-dimethylmaleimide and methacrylic or acrylic acid, as disclosed in Die Angewandte Makromolekulare Chemie Vol. 128 (1984), p. 71 to 91 are useful. In synthesizing these polymers, copolymerizing further third ingredient of vinyl monomer in addition to the aforementioned monomers makes it possible to synthesize easily a tailored-to-fit terpolymer or the like multi-copolymer. When the third ingredient of vinyl monomer is alkyl methacrylate or acrylate whose homopolymer has glass transition temperature which is not more than room temperature, flexibility may be imparted to the synthesized copolymer. Examples of photocrosslinkable polymers, which have one or more of cinnamyl group, cinnamoyl group, cinnamylidene group, cinnamylideneacetyl group and chalcone group at the side or main chain thereof, include a photosensitive polyester disclosed in U.S. Pat. No. 3,030,208 and the specifications of U.S. patent application Ser. Nos. 709,496 and 828,455.

Alkali-water-soluble photosensitive polymers obtained from these photocrosslinkable polymers include those disclosed in the specification of Japanese Patent Kokai Publication No.JP-A-60-191244 (1985), or otherwise, these disclosed in each specification of Japanese Patent Kokai Publication Nos. JP-A-62-175729 (1987), JP-A-62-175730 (1987), JP-A-63-25443 (1988), JP-A-63-218944 (1988) and JP-A-63-218945 (1988).

To the photosensitive layer containing these photosensitive polymers a photosensitizer may be also added. Examples of the photosensitizer include benzophenone derivatives, benzanthrone derivatives, quinones, aromatic nitro compounds, naphthothiazoline derivatives, benzothiazoline derivatives, thioxanthones, naphthothiazole derivatives, ketocoumarin compounds, benzothiazole derivatives, naphthofuranone compounds, pyrylium salts, thiapyrylium salts and the like. If necessary, to the photosensitive layer, binder, plasticizer or other additives may be added. Examples of the binder include chlorinated polyethylene, chlorinated polypropylene; alkyl polyacrylates; copolymers obtained by copolymerization of monomers including at least one of alkyl acrylate, acrylonitrile, vinyl chloride, styrene, butadiene; polyamide; methyl cellulose; polyvinylformal; polyvinyl butyral; methacrylic copolymer; acrylic copolymer; itaconic copolymer and the like. Examples of the plastisizer include dialkyl phthalates such as dibutyl phthalate, dihexyl phthalate; oligoethylene glycol alkyl ester; phosphoric ester and the like. It is preferable to add dye, pigment or pH indicator and the like as a printing agent for the purpose of coloring the photosensitive layer.

The photopolymerizable composition includes one or more of unsaturated carboxylic acid and its salts; ester of unsaturated carboxylic acid and multifunctional aliphatic alcohol compound; amide of unsaturated carboxylic acid and multifunctional aliphatic amine compound; and the like. A photopolymerization initiator includes vicinal polyketaldonyl compound, α-carbonyl compound, acrolein ether; aromatic acrolein compound whose α-position is substituted by hydrocarbon, polynuclear quinone compound, combination of triallylimidazole dimer and p-aminophenyl ketone, benzothiazole type compound, trihalomethyl-s-triazine, acridine, phenazine compound, oxadiazole compound and the like. A polymer, which is soluble or swellable in an alkali water as well as film-formable and used together with the aforementioned ingredients, includes copolymer of benzyl (meth)acrylate/methacrylic acid/if necessary, other addition-polymerizable vinyl monomer, copolymer of methacrylic acid/methyl methacrylate (or other methacrylate), adduct of maleic anhydride copolymer with pentaerythritol triacrylate by halt esterification, acidic vinyl copolymer and the like.

[IV] Electrophotographic photosensitive layer: For example, a photosensitive ZnO layer disclosed in U.S. Pat. No. 3,001,872 may be provided. An photosensitive layer employed in an electrophotographic photoreceptor disclosed in Japanese Patent Kokai Publication Nos.JP-A-56-161550 (1981), JP-A-60-186847 (1985) and JP-A-61-238063 (1986) may also be provided.

The amount of the photosensitive layer to be provided on the substrate ranges from about 0.1 to about 7 g/m$^2$, preferably from 0.5 to 4 g/m$^2$. In the present invention, an intermediate layer may be provided for improving adhesion between the substrate and the photosensitive layer, preventing the photosensitive layer from remaining after developing, or inhibiting halation. In order to improve the adhesion, the intermediate layer generally includes diazonium resin and adhesive compound to aluminum such as phosphoric acid compound, amino compound, carboxylic acid compound and the like. Further, the intermediate layer requires high solubility so as not to retain the photosensitive layer after developing and generally includes highly soluble and/or water soluble polymer. Further, in order to inhibit halation, the intermediate layer generally includes dye and/or UV-absorbing agent. The thickness of the intermediate layer can be adjusted arbitrarily, but should be adjusted sufficiently to provide a uniform bond-forming reaction with the upper layer of the photosensitive layer by exposure. For this reason, it is preferred that the thickness of the intermediate layer ranges generally from about 1 to 100 mg/m$^2$, especially from 5 to 40 mg/m$^2$.

On the coated photosensitive layer, protrusions may be provided independently to each other to form a mat layer. The object of forming this mat layer is to improve the vacuum adhesion between a reversed-image film and the photosensitive lithographic plate at the time of imagewise exposing with complete contact, consequently, to shorten the evacuating time as well as to prevent the deformation of microscopic dots (pixels) ascribable to insufficient contact at the time of imagewise exposing.

Examples of a process for preparing the mat layer include: that disclosed in Japanese Patent Kokai Publication No.JP- A-55-12974 (1980) which has steps of heat-fusing and adhering solid powders after powdering; that disclosed in Japanese Patent Kokai Publication No. JP-A-58-182636 (1983) which has steps of spraying and drying polymer-containing water; and the like. Any process can be applied. However, it is desirable that the mat layer itself can be dissolved in or removed with an aqueous alkaline developing solution which does not contain substantially an organic solvent.

On the photosensitive lithographic plate thus prepared, resinous image is formed in accordance with the conventional technique by treatments including development after imagewise exposing. For example, in the case of the photosensitive lithographic plate having the aforementioned photosensitive layer [I], light-exposed portion is removed by developing with such an aqueous alkali solution as disclosed in the specification of U.S. Pat. No. 4,259,434 after imagewise exposing to obtain a lithographic plate; and in the case of the photosensitive lithographic plate having the aforementioned photosensitive layer [II], unexposed portion by light is removed away by developing with such a developer as disclosed in the specification of U.S. Pat. No. 4,186,006 after imagewise exposing to obtain a lithographic plate. Alternatively, an aqueous alkaline developer composition as disclosed in Japanese Patent Kokai Publication Nos.JP-A-59-84241 (1984), JP-A-57-19252 (1982) and JP-A-62-24263 (1987) may be used in developing for obtaining a positive lithographic plate.

The following explanation is on the preferred embodiments of the present invention. Less than 4 $\mu$m of an average height in a central line of the protrusions tends to make it difficult to prevent efficiently the collapse of the mat. In this contrast, more than 30 $\mu$m of the average height tends to make it difficult to ensure the strength of a substrate in the photosensitive lithographic plate. More preferable average height in the central line of the projections ranges from 5 to 20 $\mu$m. Preferably the protrusions are made of a resin, which effectively prevents the photosensitive layer from damage arising in the course of manufacturing.

Although the density of the protrusions is different dependent on the size of each projections, it is preferable not more than 5,000/cm$^2$ in terms of their numbers, more preferable in the range of 100 to 4000/cm$^2$. The protrusions may be in the shape of a dot, a stripe, a lattice or any other design including company-identifying mark or the like.

Preferable material of the protrusions includes styrene, acrylic ester, acrylic copolymer and polyester. Other materials such as a variety of aqueous resins, thermoplastic resins, thermosetting resins, EB curable resins and UV curable resins can be used for forming the protrusions.

In forming the protrusions, screen coating or hot-melt spray coating is preferably applied. Other preferable processes for forming the protrusions include gravure coating, die coating, bar coating, electrostatic spray coating and electrostatic powder coating. Other processes than those described above may be employed for forming the protrusions.

As to the materials and production processes of the substrate, the photosensitive layer, the mat layer and the like, those disclosed in Japanese Patent Kokai Publication No.JP-A-7-132688 (1955) may be referred and incorporated here in this specification, if necessary.

EXAMPLES

Concrete examples of the present invention will be described as follows.

Comparative Example 1

One surface of an aluminum plate having a thickness of 0.240 mm was grained (roughened) with a nylon brush and an aqueous suspension of 400 mesh pumice stone, rinsed in water, dipped into an aqueous tribasic sodium phosphate solution of 70° C., then rinsed in water and dried. Next, 1 part by weight of polyhydroxyphenyl naphthoquinone-1,2-diazied-5-sulfonate obtained from polycondensation of acetone and pyrogallol disclosed in Japanese Patent Kokoku Publication No.JP-B-43-28403 (1968) and 2 parts by weight of a novolac phenol-formaldehyde resin were dissolved into a mixture of 20 parts by weight of 2-methoxyethylacetate and 20 parts by weight of methyl ethyl ketone to prepare a photosensitive solution. By coating the thus prepared photosensitive solution on the grained surface of the above substrate and then drying, a photosensitive layer was coated on the substrate.

Subsequently, by using a rotational electrostatic spray coater at 20,000 rpm and 20 cc/min. of a coating supply speed into the coater a matting agent was coated on the above photosensitive layer. The matting agent containing a copolymer of acrylic ester, acrylic acid and methacrylic acid was used. The molar ratio of acrylic ester/acrylic acid/methacrylic acid at the time of polymerization was 30/30/40.

The thus prepared photosensitive lithographic plate was wound 5000 m at a winding step and cut into pieces at a subsequent processing step, and after sampling the pieces of the most outer and inner parts in the wound plate, the time of these samples required for vacuum adhesion was measured. As a result, the time required for vacuum adhesion of the outer sample was 30 seconds, and that of the inner sample 60 seconds. By the observation of a mat adhering state in both of the samples with a scanning electron microscope it turned out that no remarkable damage was observed in the mat of the outer sample, but that collapses considered to be generated by a pressure caused by winding were observed in the mat of the inner sample.

Reference Example 1

Before the winding step of the photosensitive lithographic plate prepared in the same procedure of Comparative Example 1 (and Example 1), on the back surface of the substrate a 15% aqueous solution of styrene, acrylic ester and acrylic acid was coated by applying screen coating and then drying was made to form a dot-appearing layer of about 1,000 protrusions per 1 cm$^2$ having radii of about 80 $\mu$m, average surface roughness in the central line of 3 $\mu$m and average height in the central line of 1.8 $\mu$m. The thus prepared photosensitive lithographic plate was wound 5,000 m and cut into pieces at a subsequent processing step, and after sampling the pieces of the most outer and inner parts in the wound plate, the time of these samples required for vacuum adhesion was measured. As a result, the time required for vacuum adhesion of the outer sample was 30 seconds, however, as to the inner sample 50 seconds were required for vacuum adhesion. By the observation of the mat adhering state in both of the samples with a scanning electron microscope it turned out that no remarkable damage was observed in the mat of the outer sample, but that collapses considered to be generated by a pressure due to winding were observed in the mat of the inner sample.

Example 1

Before the winding step of the photosensitive lithographic plate prepared in the same procedure of Comparative Example 1, on the back surface of the substrate a 30% aqueous solution of styrene, acrylic ester and acrylic acid was coated by applying screen printing and then drying was made to form a dot-appearing layer of about 1,000 projections per 1 cm² having radii of about 70 μm, average surface roughness in the central line of 10 μm and average height in the central line of 5.8 μm. The thus prepared photosensitive lithographic plate was wound 5,000 m and cut into pieces at a subsequent processing step, and after sampling the pieces of the most outer and inner parts in the wound plate, the time of these samples required for vacuum adhesion was measured. As to the both of the samples, the time required for vacuum adhesion was 30 seconds. By the observation of the mat adhering state in both of the samples with a scanning electron microscope it turned out that no remarkable damage was observed in the mat of the both samples. The protrusions provided on the back surface of the substrate can be dissolved at a developing step so that the same handling as Comparative Example 1 can be employed even in the printing step.

Example 2

Before the winding step of the photosensitive lithographic plate prepared in the same procedure of Comparative Example 1 except that an aluminum plate of 0.220 mm in thickness was used as a substrate, on the back surface of the substrate a polyester was coated by applying a hot-melt spray coating and then calendering was made to form a dot-appearing layer of about 200 protrusions per 1 cm² having radii of about 400 μm, average surface roughness in the central line of 20 μm and average height in the central line of 18 μm. The thus prepared photosensitive lithographic plate was wound 5,000 m and cut into pieces at a subsequent processing step, and after sampling the pieces of the most outer and inner parts in the wound plate, the time of these samples required for vacuum adhesion was measured. As to the both of the samples, the time required for vacuum adhesion was 30 seconds. By the observation of a mat adhering state in both of the samples with a scanning electron microscope it turned out that no remarkable damage was observed in the mat of the both samples. The polyester remained on the back surface of the photosensitive lithographic plate even after plate making so that apparent thickness on a printer was not changed, thereby the same handling as Comparative Example 1 could be employed even in the printing step.

These examples disclosed above proves that Examples 1 and 2 of the present invention made it possible to prevent the deterioration of vacuum adhesion resulting from the mat collapsed in the production process of the photosensitive lithographic plate including the step of winding.

Further, these examples disclosed above are based on the experiments which led the present invention to be accomplished, and accordingly never limit the scope of the invention. Various modifications can be made in accordance with the disclosure of the present specification and drawings.

The meritorious effects of the present invention are summarized as follows.

According to the present invention, by the protrusions provided on a substrate, the deterioration of vacuum adhesion due to the collapse of a mat is prevented, and the mat state is held independent of the wound position of the photosensitive lithographic plate, thereby the photosensitive lithographic plate provides a uniform quality in making vacuum adhesion so that complete contact can be made within a predetermined shortened time. Further, no matter whether there is a winding step involved in the course of manufacturing or not, the resistance of the photosensitive lithographic plate to the load is significantly improved. Moreover, the protrusions in the form of a layer are provided on the back surface of the substrate so that in proportion to the laminated protrusions the use amount of a substrate material is reduced, thereby, the material cost of interest can be saved to provide a photosensitive lithographic plate at a low cost. Still more, the projections can be made easily at a low cost by coating a resin on the back surface of the substrate so that degrees of freedom in designing the pattern of the protrusions become high, consequently, added values can be enhanced e.g., by drawing a desired mark on the back surface of the substrate.

It should be noted that modification obvious in the art may be done without departing the gist and scope of the present invention as disclosed herein and claimed hereinbelow as appended.

What is claimed is:

1. A photosensitive lithographic plate comprising a substrate, a photosensitive layer coated on a surface of said substrate, and a mat layer formed on said photosensitive layer, wherein a plurality of resinous protrusions are provided in a layer on the back surface of said substrate, said protrusions having an average height in a central line of 5 to 20 μm so as to prevent collapse of the mat layer upon winding of the photosensitive lithographic plate.

2. The photosensitive lithographic plate as defined in claim 1, wherein at least 50% of said protrusions have a 80 to 120% height of an average height from the back thereof.

3. The photosensitive lithographic plate as defined in claim 1, wherein said protrusions are made of a resin that is soluble in a developer solution for developing the photosensitive lithographic plate.

4. The photosensitive lithographic plate as defined in claim 1, wherein said protrusions are made of a resin that is insoluble in a developer solution for developing the photosensitive lithographic plate.

5. The photosensitive lithographic plate as defined in claim 1, wherein said protrusions have dot-appearing shape.

6. The photosensitive lithographic plate as defined in claim 1, wherein said protrusions have striped shape.

7. A process for preparing a photosensitive lithographic plate comprising:

providing a photosensitive layer coated on the surface of a substrate of said substrate, providing a mat layer formed on said photosensitive layer and winding the photosensitive lithographic plate, wherein a resin is coated on the back surface of said substrate to provide plural protrusions made of said resin in the form of a layer, said protrusions having an average height in a central line of 5 to 20 μm so as to prevent collapse of the mat layer upon winding of the photosensitive lithographic plate.

8. A photosensitive lithographic plate comprising a substrate, a photosensitive layer coated on a surface of said substrate, and a mat layer formed on said photosensitive layer, wherein a plurality of resinous protrusions are provided in a layer on the back surface of said substrate, said protrusions having an average height in a central line of 4 to 30 μm and at least 50% of said protrusions have a 80 to 120% height of an average height from the back thereof so as to prevent collapse of the mat layer upon winding of the photosensitive lithographic plate.

9. A photosensitive lithographic plate comprising a substrate, a photosensitive layer coated on a surface of said substrate, and a mat layer formed on said photosensitive layer, wherein a plurality of resinous protrusions are provided in a layer on the back surface of said substrate, said protrusions are made of a resin that is insoluble in a developer solution for developing the photosensitive lithographic plate and having an average height in a central line of 4 to 30 μm so as to prevent collapse of the mat layer upon winding of the photosensitive lithographic plate.

10. A photosensitive lithographic plate comprising a substrate, a photosensitive layer coated on a surface of said substrate, and a mat layer formed on said photosensitive layer, wherein a plurality of resinous protrusions having a striped shape are provided in a layer on the back surface of said substrate, said protrusions having an average height in a central line of 4 to 30 μm so as to prevent collapse of the mat layer upon winding of the photosensitive lithographic plate.

* * * * *